United States Patent
Liu et al.

(10) Patent No.: US 8,486,800 B2
(45) Date of Patent: Jul. 16, 2013

(54) TRENCH CAPACITOR AND METHOD FOR PRODUCING THE SAME

(75) Inventors: Jin Liu, Amersfoort (NL); Aarnoud Laurens Roest, Geldrop (NL); Freddy Roozeboom, Waalre (NL); Vahid Shabro, Austin, TX (US)

(73) Assignee: NXP B.V., Eindhoven (NL)

( * ) Notice: Subject to any disclaimer, the term of this patent is extended or adjusted under 35 U.S.C. 154(b) by 205 days.

(21) Appl. No.: 12/995,452

(22) PCT Filed: May 26, 2009

(86) PCT No.: PCT/IB2009/052201
§ 371 (c)(1),
(2), (4) Date: Nov. 30, 2010

(87) PCT Pub. No.: WO2009/144662
PCT Pub. Date: Dec. 3, 2009

(65) Prior Publication Data
US 2011/0073994 A1    Mar. 31, 2011

(30) Foreign Application Priority Data

May 30, 2008  (EP) ..................................... 08104181
May 26, 2009  (WO) .................. PCT/IB2009/052201

(51) Int. Cl.
*H01L 21/20* (2006.01)
*H01L 21/8242* (2006.01)
*H01L 21/336* (2006.01)

(52) U.S. Cl.
USPC ........... 438/386; 438/387; 438/243; 438/244; 438/268

(58) Field of Classification Search
USPC ................. 438/386, 424, 532, 957, 156, 206, 438/209, 212, 243, 244, 268, 387, 393, 396
See application file for complete search history.

(56) References Cited

U.S. PATENT DOCUMENTS

| 5,501,893 A | 3/1996 | Laermer et al. |
| 2003/0011016 A1* | 1/2003 | Agarwal et al. ............... 257/310 |
| 2007/0040204 A1 | 2/2007 | Pulugurtha et al. |

OTHER PUBLICATIONS

Bharadwaja, S.S., et al., "Processing and Properties of High Aspect Ratio Ferroelectric Structures"; 2004 IEEE Intl Ultrasonics, Ferroelectrics, and Frequncy Control Joint $50^{th}$ Anniv Conf; 4 Pages; (2004).

Floquet, Nicole, et al; "Correlation Between Structure Microstructure, and Ferroelectric Properties of PbZr0.2ti0.8O3 Integrated Film: Influence of the Sol-Gel PRocess and the Substrate"; Journal of Applied Physics, vol. 84, No. 7; 12 Pages (Oct. 1, 1998).

Chen, Q. W., et al; "A Way to Obtain Visible Blue Light Emission in Porous Silicon"; Applied Physics Letter, vol. 82, No. 7; (Feb. 17, 2003).

(Continued)

*Primary Examiner* — Chuong A. Luu

(57) ABSTRACT

A method of fabricating a trench capacitor, and a trench capacitor fabricated thereby, are disclosed. The method involves the use of a vacuum impregnation process for a sol-gel film, to facilitate effective deposition of high-permittivity materials within a trench in a semiconductor substrate, to provide a trench capacitor having a high capacitance while being efficient in utilization of semiconductor real estate.

13 Claims, 4 Drawing Sheets

OTHER PUBLICATIONS

Zhou, Q.F., et al; "High Frequency Broadband PZT Thick Film Untrasonic Transducers for Medical Imaging Applications"; Ultrasonics Elsevier Netherlands, vol. 44; 6 Pages (Dec. 22, 2006).

Mina, I. G., et al; "Molding of High Aspect Ratio Ferroelectric Microstructures"; 2004 14$^{th}$ IEEE Intl Symp on Applications of Ferroelectrics; IEEE Piscataway, NJ, US; pp. 258-261 (2004).

McMillan, L. D., et al; "Deposition of BA1-xSrxTiO3 and SrTi03 Via Liquid Source CVD (LSCVD) for ULSI Drams"; Integrated Ferroelectrics, UK, Vol. 4, No. 4; p. 319-324 (1994).

International Search Report and Written Opinion for Application PCT/IB2009/052201 (Jul. 16, 2009).

* cited by examiner

TRENCH CAPACITOR AND METHOD FOR PRODUCING THE SAME

FIELD OF THE INVENTION

This invention relates to integrated capacitors, and a method for producing them. In particular, it relates to a method for fabricating trench capacitors, and trench capacitors fabricating thereby.

BACKGROUND OF THE INVENTION

Integrated capacitors and in particular trench capacitors, are of increasing importance in several fields of application. One such field is integrated circuits contained in portable wireless communication devices, such as mobile telephone handsets, where trench capacitors are proving useful, as a part of passive integration technology.

Mobile telephone handsets have witnessed a strong innovative drive to smaller and cheaper products with increased functionality and performance while still meeting the tight constraints for mass production within a short product lifetime. This combination of conflicting trends provides a motivation for the innovative improvement in the passive component content of a telephone.

It is estimated that in a single-mode telephone, passive components account for 90 percent of the component count, 80 percent of the size and 70 percent of the cost. High quality passive components are especially prevalent in the RF front end and radio transceiver sections of the telephone and thus tend to increase proportionally as the number of operating modes (and thus frequency bands) increase.

One direct approach to reducing the passive component content in a telephone is passive integration technology. This technique allows several passive components to be integrated, either into a substrate or as a stand-alone component.

Significant progress has already been demonstrated in technology partitioning within an RF module platform to optimize size, cost and performance, and this partitioning concept can be extended beyond integrated (L,C,R), circuits. For example, as shown in FIG. 1, decoupling, filtering and switching are all electrical functions which cannot be effectively integrated on active silicon and which are required in the generic circuit blocks which form the RF front end of a radio transceiver.

FIG. 1 shows the RF front end of a telephone handset, comprising a transceiver ASIC (application specific integrated circuit) 1, which is connected to a dual-band voltage controlled oscillator (VCO) 2, and thence via a dual-band power amplifier (PA) 3 and switchplexer 4 to the antenna 5. Receiver filters 6 are connected between the switchplexer and transceiver ASIC. As well as switching element 7, the switchplexer includes a decoupling capacitor 8, and RF (L,C) coupler 9. Further decoupling capacitors 8, and RF (L,C,R) circuits also comprise parts of the transceiver ASIC, VCO, an PA.

From FIG. 1 it is apparent that the passive components, and in particular decoupling capacitors, comprise a significant part of the component count, and thence the space and cost of the complete unit.

Passive integration into partitioned circuit elements and their combination within an RF module platform provides a unique and powerful tool for minimizing the passive component count within a cellular telephone and is a key enabler for developing smaller, cheaper and more powerful wireless products with lower loss and form factors suitable for mass production.

A key element in passive integration is the (integrated) capacitor technology. Existing technologies to produce integrated passive components include planar MIM (metal-insulator-metal) technology and trench capacitor technology, both of which are now in mass production, and RF modules containing both technologies are commercially available from, for example, NXP Semiconductors.

The planar MIM capacitor technology uses high-k ferroelectric thin films such as barium strontium titanate $Ba_{1-x}Sr_xTiO_3$— (BST), lead zirconate titanate $PbZr_xTi_{1-x}O_3$ (PZT), or lead lanthanum zirconate titanate (PLZT) to achieve high capacitance densities. The high-k ferroelectric materials can offer relative permittivity ranging from several hundreds to more than thousand. The breakdown voltages are typically of 50-250 V.

The trench capacitor technology uses porous silicon to achieve high capacitance densities. The trench/pore arrays in macro-porous Si substrate have been demonstrated to enlarge the capacitor surface area of the order of 20 to 30 times. Dielectrics like $SiO_2$ and $Si_3N_4$ with relative permittivity of 4-7 are used because they can be easily grown into the deep trenches. The breakdown fields are typically of 6-10 MV/cm, translating in breakdown voltages of typically 15-32 V.

However, the dielectric materials which have been available for use in the trench capacitor technology have lower relative permittivity than those achievable with planar MIM technology.

US patent application US2007/0040204 discloses a three-dimensional capacitor utilising BST or PZT, by providing a laminated foil on top of the semiconductor substrate, and forming high-k films within trenches within the laminated foil.

Thus there remains an ongoing need to provide an effective, integrated capacitor technology, which is cost-effective space efficient and allows use of high-k materials.

SUMMARY OF THE INVENTION

It is an object of the present invention to provide a method of fabricating an integrated capacitor which allows the use of high-k materials, whilst benefiting from space-efficient trench configuration.

According to the present invention there is provided a method of fabricating a trench capacitor comprising the sequential steps of:

(a) forming a trench in a substrate (b) depositing a layer of an electrically conductive material in the trench, (c) depositing a layer of a material having a high electrical permittivity within the trench by means of vacuum infiltration of a sol-gel precursor, the sol-gel precursor material comprising the material having a high electrical permittivity (d) depositing a further layer of electrically conductive material in the trench, and (e) heating the substrate to anneal the layers.

Preferably, the material has an electrical permittivity of at least 8 and is a ferroelectric material or a ferroic material. Perovskite materials have suitably high electrical permittivity, in practice it has been found that the group consisting of PZT, PLZT and BST are particularly suited to this application, and allow for convenient precursor materials.

Preferably, the substrate is silicon, step (a) comprises dry etching of the silicon through an etch-mask and an oxide layer is provided to line the sidewalls and base of the trench prior to step (b). Dry-etching provides a particularly convenient method of forming high aspect-ratio trench, and lining the trench with oxide ensures good electrical isolation from other components.

Preferably, the trench has width which is between 1 μm and 10 μm and a high aspect ratio such that it has a depth which is between twice and twenty times its width; this allows for a space-efficient capacitor.

Preferably, an adhesion layer is deposited subsequent to step (a) and preceding step (b). Deposition of such an adhesion layer relaxes the adhesion requirements of the layer deposited in step (b).

Preferably, step (c) is carried out a plurality of times prior to step (d). Thus the thickness of the deposited sol-gel layer can be accurately controlled.

Advantageously, the sequence of steps (c) and (d) may be repeated at least once, to achieve a stacked capacitor. This can provide a particularly space-efficient solution.

Preferably, in order to ensure good layer uniformity or reliable component properties, the substrate is cleaned between steps (c) and (d) by any one of more of wiping with a swab, shaking, or evaporation in vacuum or wiping whilst in an inverted orientation.

Preferably, step (d) comprises subjecting the substrate to a first environment of between 150° C. and 300° C. for between 1 and 2 minutes, following by subjecting it to a second environment of between 300° C. and 700° C. for between 5 and 10 minutes. Such an annealing process has been found in practice to provide a more uniform surface and lowers the resistivity for an electrode subsequently deposited on the oxide.

Preferably, at least one of the first and second environments has a controlled oxygen level associated with it. This has been found to avoid deterioration of the layers.

Preferably the layer of electrically conductive material and the further layer of electrically conductive material each comprise one of La—Ni-oxide (LNO), palladium or platinum. These provide particularly effective electrode materials for the capacitor.

According to another aspect of the invention, there is provided a trench capacitor formed by any one of the above methods. Preferably, the trench capacitor is comprised in an integrated circuit. Such a device is particularly suited to taking advantage of the simple sol-gel based processing disclosed herein.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which.

Figure 1:
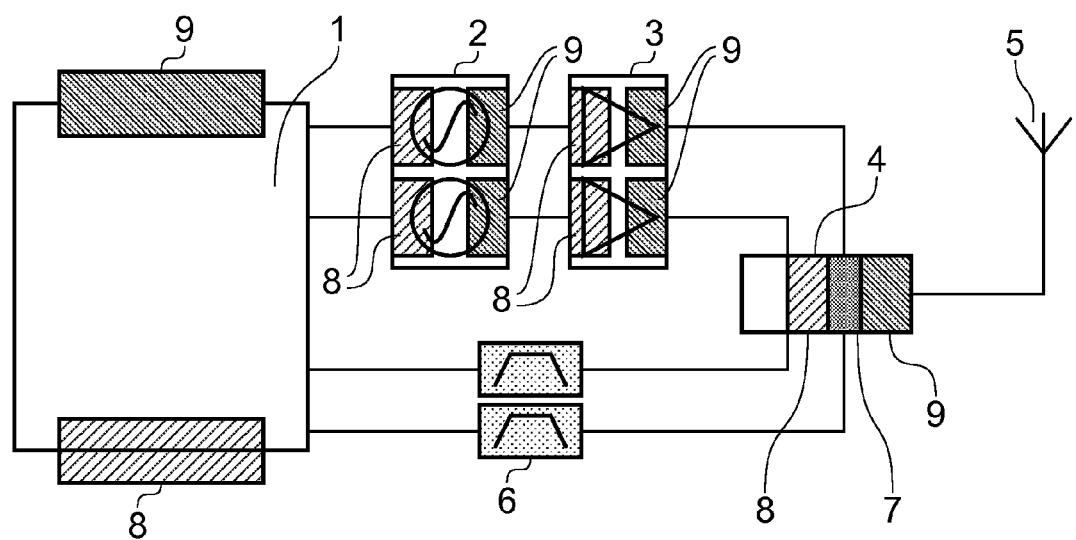
FIG. 1 illustrates a typical RF front end of a telephone handset showing the requirements for passive components.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

Figure 2:
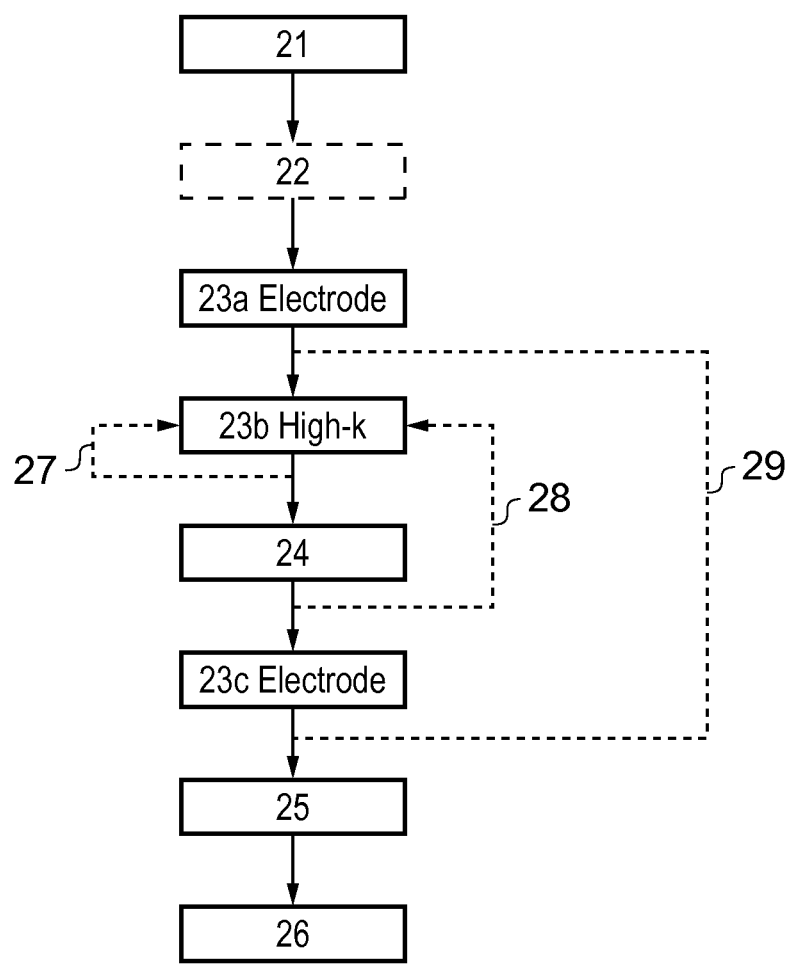
FIG. 2 shows an example structure of an integrated capacitor.

FIG. 2 shows a flow chart of a process according to an embodiment of the invention.

At process step 21, deep trenches are fabricated in a Si substrate. This is carried out by conventional means, for example by known dry etching techniques, such as reactive ion etching or reactive ion beam etching. The etching is used to create high aspect ratio trenches in the substrate. Another alternative suitable etching process is the so-called "Bosch" process. In this process, the high aspect ratio features are etched anisotropically, in a time-multiplexed way by alternatively introducing fluorine-based gas (typically $SF_6/O_2$) and a fluorocarbon gas (such as $C_4F_8$) into the plasma. The former gas etches the feature (pore, trench, etc.) and the latter forms a Teflon-like passivation layer on the pore walls. This process is disclosed in U.S. Pat. No. 5,501,893 "Method of anisotropically etching silicon".

A convenient substrate, which is particular appropriate for integrating passives into ASICs or other ICs is <100> oriented silicon. Particularly when the invention is carried out with low-resistivity silicon, to avoid electrical crosstalk, the trenches are then oxidized at step 22, to form a good $SiO_2$ isolation layer. Oxidation is carried out by conventional means such as growing a thermal oxide, deposition of low temperature LOCOS, or other means such as will be readily apparent to those skilled in the art. In FIG. 2, however, this step 22 is shown as a dotted line, since the step may not be required if a suitable high-resistivity or other substrate, such as a semi-conductor on insulator, is used.

Steps 23a, 23b, and 23c are vacuum infiltration processes, which will be described in more detail hereunder, with reference to FIG. 4. However, in summary, in the presence of vacuum, air is evacuated from the trench, which allows sol-gel precursor solution to penetrate into the trench. After the evaporation of the solution a layer will remain, having been deposited on the exposed surface, including the sidewalls and bottom of the trench. A vacuum is developed 1 minute before the immersion and after 5 minutes of immersion the sample is taken out of the vacuum.

Prior to step 23a, an adhesion layer such as titania ($TiO_x$) or titanium (Ti) (which is later oxidized during the process) may be deposited. If the deposited layer is Ti, it will be, to at least some extent, oxidised to $TiO_x$ during subsequent processing. Ti and $TiO_x$ are known as suitable adhesion layers; however, other such adhesion layers which will be known or apparent to the person skilled in the art may be used. The use of an adhesion layer has the effect of relaxing the adhesion requirements of the layer to be deposited in step 23a.

At step 23a, the vacuum infiltration is of an electrode material for the capacitor; at step 23b, for the high-k dielectric; and at 23c for the other electrode.

The high-k dielectric material is typically one of the Perovskite family of materials. Members of this family, which includes the preferred materials BST, PZT, and PLZT, generally exhibit a remarkable high dielectric constant—many of the members of the family have relative dielectric constant exceeding 100 or even 1000, which makes them particularly suitable for this application. They are deposited from a sol-gel precursor. The choice of individual sol-gel precursors, to produce a specific sol-gel layer, is well known to the skilled person and so is not described here.

Any suitable electrically conductive material, for which a sol-gel precursor is available, may be used as the electrode material. However, it has been found in practice that Lanthanum Nickelate (LNO), platinum (Pt) and palladium (Pd) are particularly suitable materials.

As with other sol-gel processes, process step 23b may be repeated for a number of times, in order to build up the deposited layer to an arbitrary thickness. The optional repetition of this step is shown by dashed flow-line 27. The choice of layer thickness is relevant for the design of the specific capacitor required; however, the thickness must be adequate to ensure adequate breakdown voltage of the capacitor, yet thin enough (particularly in a stacked configuration) to ensure the device fits inside the physical envelope of the trench and provides sufficiently high capacitance for the application, In step 24, surface cleaning is carried out. Such a surface cleaning step may comprise any one or more of, cotton sweeping with cotton swab, air flow across the device, (which will be described in more detail hereunder with reference to FIG. 5), wiping with wet cotton preferably whilst the substrate is upside-down or inverted, shaking or vibrating the substrate, and evaporation in a vacuum—again preferably whilst the substrate is upside down. Other suitable cleaning methods will be apparent to the skilled person.

Although the invention is not limited to this aspect, cleaning the substrate at this point of the process may enhance a more uniform solution distribution on the surface and in the pores.

Moreover, it has been found in practice, that combining one or more of the cleaning techniques above with a platinum (Pt) deposition by sputtering (physical vapour deposition of PVD) may in some circumstances provide a better surface coverage. This is because the Pt gives better conductance of the bottom electrode, because Pt is a better conductor than La—Ni-Oxide (LNO): besides this, it is possible to deposit for example LNO via sol-gel in the trenches and clean the surface afterwards, because it is difficult to create a conducting layer in the trenches and on the top-surface which is thick enough but not to thick (cleaning the top surface will in general not lead to a conducting layer on the top-surface but this may be compensated by the Pt deposition). Pt deposition—by conventional vacuum deposition processes such as sputtering—on its own will not normally produce a continuous layer in the trenches which makes the combination with LNO advantageous. An alloy or solid solution of palladium and platinum (Pt/Pd) can also be deposited via sol-gel like LNO, or even one of the metals alone, for instance Pt, but this is more difficult, and so is not the preferred method.

In another embodiment, further individual depositions of the high-k material are infiltrated to provided a thicker overall layer, after the cleaning step 24. This is shown by dashed flow-line 28.

After the cleaning step 24, a second electrode for the capacitor is deposited, by vacuum infiltration in step 23c as already indicated. That is to say, after depositing the dielectric a second electrode is deposited. This can again be a combination of LNO deposited via sol-gel into the pores and Pt for a good top surface coverage.

Further, in a further alternative embodiment, a capacitor stack is fabricated, in which infiltration of the dielectric material (at 23b) and of the electrode material (at 23c) are carried out alternately. The modified process flow for this embodiment is shown by dashed flow-line 29.

At process step 25, post-annealing is carried out. Alternatively, this post-annealing can be done before step 29 so after deposition of individual capacitors of the stack. Post-annealing comprises subjecting the substrate to a high temperature environment, and can aid in achieving a more uniform surface finish (than would be the case is post-annealing is not carried out), and may help to lower the resistivity and density and result in better morphology for the oxide electrode. Annealing will lead to a better material (more dense for example) with a better conductivity, since organics of the sol-gel process are burned and released in those steps. In this particular embodiment, the annealing is carried out in two stages: in a first stage, the substrate is placed onto a hotplate, which is held at a temperature of between 150° C. and 300° C. The substrate is left on the hotplate for between 1 and 2 minutes. This is followed by a higher temperature anneal, in which the substrate is placed into a furnace, which is held at a temperature of between 300° C. and 700° C. for between 5 and 1 minutes. During at least one of these post-annealing stages, oxygen—or another oxidising gas—should be present, in order to remove any organic material. However, it has been found advantageous, under some conditions, to limit the amount of oxygen in the atmosphere, in order to avoid deterioration of the device. A furnace anneal lends itself particularly conveniently to accurate control of the gaseous composition of the annealing environment.

Such a two-stage annealing process is preferred, for the following reason: working with sol-gel it is always essential to remove all organics in order to get a good and dense material. So the electrodes should be conductive enough and the dielectric should have optimum (highest) dielectric constant combined with the lowest leakage. About 90% of the starting material is organic which means that there is a huge volume decrease upon annealing. If this is done in a single step then the material becomes porous which will lead to a low conductance for electrodes and a bad dielectric constant for the dielectric.

The final process step in this embodiment is a final anneal stage. This step (shown at 26), comprising a furnace anneal at between 700° C. and 800° C., for between 10 and 30 minutes. Final annealing in oxygen ambient has been found to be particularly convenient, in order to achieve a high quality crystal structure for the thin film layers.

Figure 3:
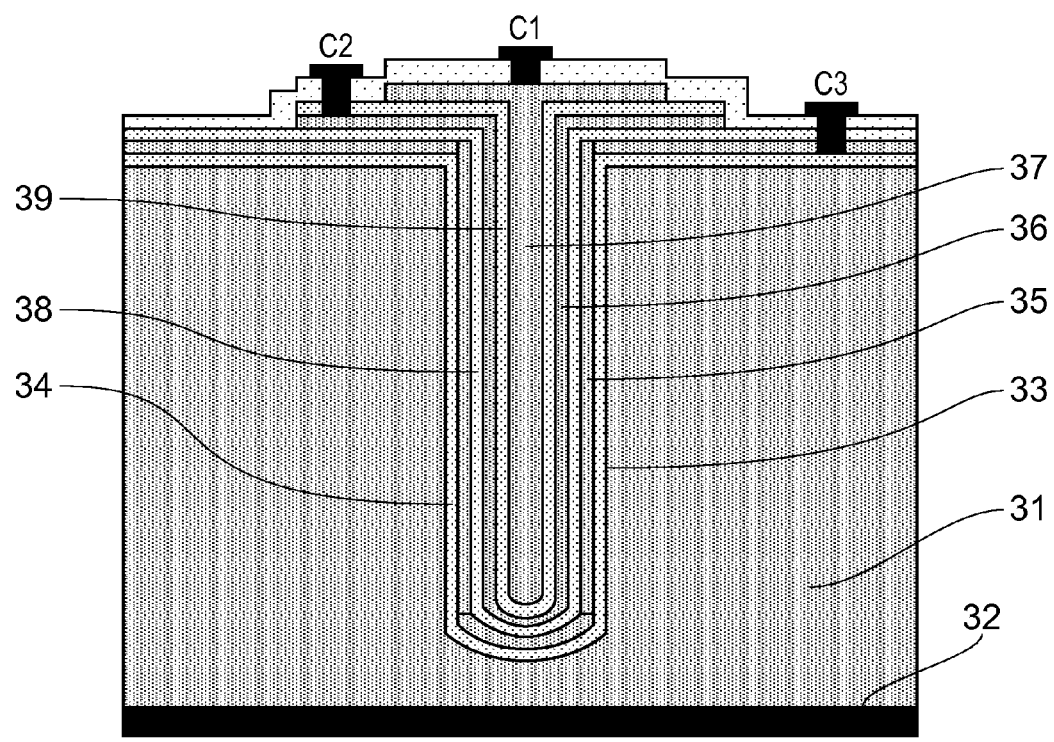
FIG. 3 shows a flow-chart of a method according to an embodiment of the invention.

An example of a trench-capacitor, fabricated according the sequence just described and corresponding to the further alternative embodiment, is shown in FIG. 3. This shows a double capacitor layer stack, fabricated in a silicon semiconductor substrate 31 having a rear-side contact 32. Within the substrate 31 is a trench 33, the sidewalls and base of which is lined with oxide 34. Deposited onto the electrode, by a vacuum infiltration process, is first electrode layer 35, to which contact may be made by means of first electrode contact C3. Deposited onto the first electrode layer is first high-k layer 38, which is also formed by vacuum infiltration. This layer forms a sandwich between the first electrode layer 35 and a second electrode layer 36, contact to which may be made by means of second electrode contact C2. On this layer is a further layer 39 of high-k material, again formed by vacuum infiltration. This further layer 39 forms a sandwich between the second electrode layer and a third electrode layer 37, to which contact may be made by means of third electrode contact C1.

As shown in FIG. 3, the third electrode layer fills the trench—that is to say, it fills the whole of the gap between the high-k layers on each side-wall of the trench. Alternatively, the trench may be wider, such that there remains a gap between the third electrode layer deposited on the second high-k layer on one sidewall of the trench, and that deposited on the second high-k layer on the other sidewall of the trench. In that case, as the skilled person will readily appreciate, further pairs of high-k and electrode layers may be fabricated, to provide a capacitor stack having more than two high-k layers. In a further alternative embodiment, the capacitor may have just a single high-k layer and two electrodes.

Some of the electrode contacts in a stack may be electrically connected in the device, to provide one or more capacitors having a higher capacitance than that of a single high-k layer.

Some of the process steps will now be described in more detail, with reference to FIGS. 4 and 5.

Figure 4:
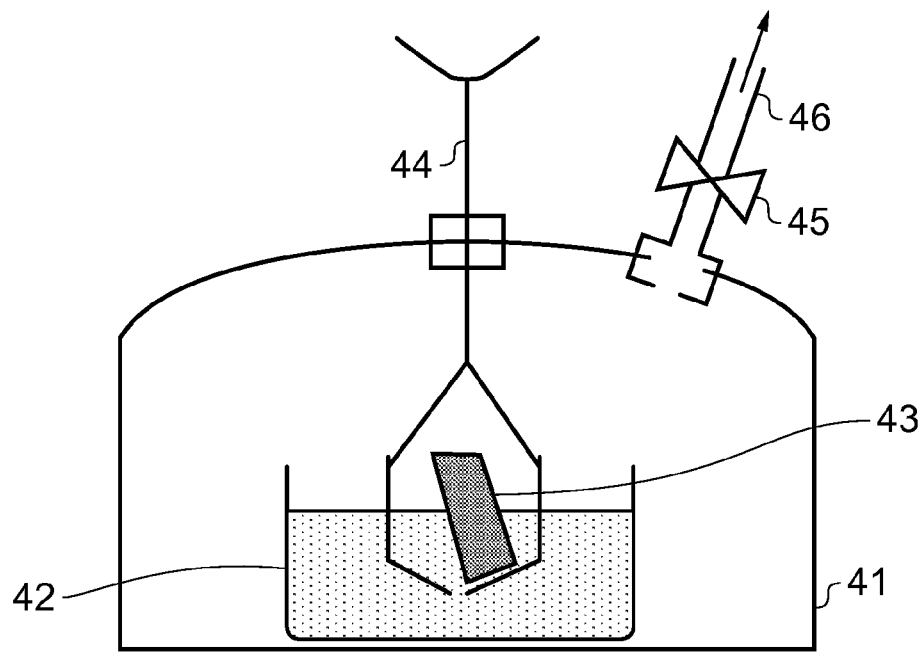
FIG. 4 shows schematically an apparatus suitable for vacuum infiltration of a sol-gel layer.

Referring to FIG. 4, process step 23 (that is, 23a, 23b and 23c), is carried out in a vacuum environment, such as within a vacuum chamber 41. Neither the level of vacuum nor the means of it's production are critical, but it may typically be of the order of 0.1 mTorr. Such a vacuum is readily achievable using a rotary pump, with or without a high-speed roots blower for fast evacuation of the vacuum chamber 41.

A container of sol-gel precursor 42 is located within the vacuum, suitable position, such that the sample 43 can be immersed into the pre-cursor 42. After the sample is loaded into the chamber 41, air is evacuated from the chamber via port 46, by opening valve 45 for an interval of time. The interval may be predetermined, or its endpoint may be determined by, for instance, monitoring the cessation of bubbling or degassing of the sol-gel precursor. Using the handle 44, the sample 43 is immersed into the pre-cursor for a fixed time, and then removed. The prior evacuation of air from the trench facilitates penetration of the sol-gel precursor 42 into the trench, and after the sample is removed from the precursor liquid, most of the precursor evaporates, leaving a thin layer of sol-gel material, having a well-defined thickness, in the trench (and on the substrate surface).

In one particular experimental set-up. the samples are spin-coated and then put it into vacuum to better impregnate the pores. Alternatively, the spin-coater could be inside a closed box or vacuum chamber which can be evacuated to a certain level to degas the pores properly. Thus the process is similar to, but not the same as, conventional spin-drying equipment, in which a wafer is placed horizontally on a rotating chuck that is placed in a sort of drum-like chamber with a plastic lid. The drum is then evacuated to simple vacuum (rotary oil pump is sufficient for this; expensive pumps like turbo-molecular pumps, roots blowers, etc., are not required).

Figure 5:
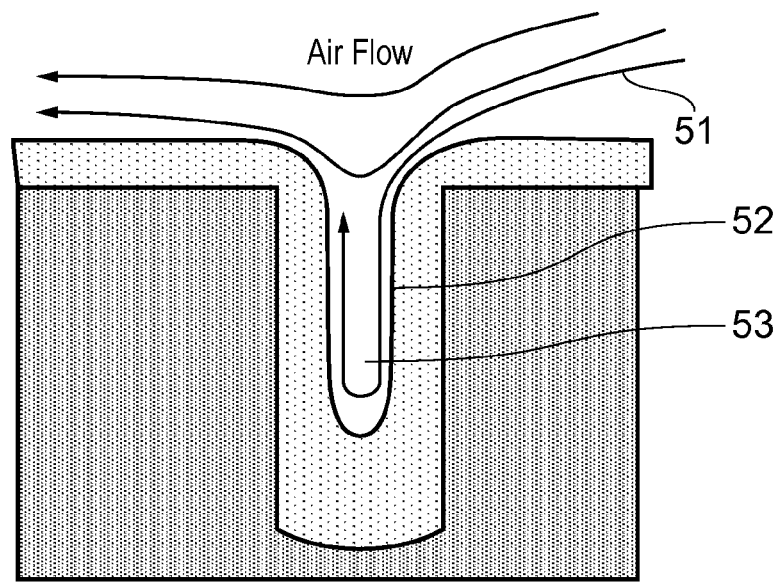
FIG. 5 illustrates the concept of air-flow cleaning.

Referring now to FIG. 5, one method for cleaning the substrate is by air flow. By directing a flow of air 51 over the surface of the substrate, some of the flow is directed into the trench 52. By means of the Venturii effect, any liquid sol-gel precursor 53 remaining in the trench 52 is pulled out of the trench, and the substrate is thereby cleansed of unwanted material. To some extent, using this method, the layer thickness of the surface layer may get thinner and also some of the deposited material inside the trenches may be removed thereby.

From reading the present disclosure, other variations and modifications will be apparent to the skilled person. Such variations and modifications may involve equivalent and other features which are already known in the art of semiconductor fabrication processes and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A method of fabricating a trench capacitor comprising the steps of:
   (a) forming a trench in a substrate
   (b) depositing a layer of an electrically conductive material in the trench,
   (c) depositing a layer of a material having a high electrical permittivity within the trench by vacuum infiltration of a sol-gel precursor, the sol-gel precursor material comprising the material having a high electrical permittivity,
   (d) depositing a further layer of electrically conductive material in the trench, and
   (e) heating the substrate to anneal the layers.

2. A method according to claim 1, wherein the material has an electrical permittivity of at least 8 and is a ferroelectric material or a ferroic material.

3. A method according to claim 1, wherein the material is a Perovskite material.

4. A method according to claim 3, wherein the material is selected from the group consisting of PZT, PLZT and BST.

5. A method according to claim 1 wherein the substrate is silicon, step (a) comprises dry etching of the silicon through an etch-mask and an oxide layer is provided to line the sidewalls and base of the trench prior to step (b).

6. A method according to claim 1, wherein the trench has width which is between about 1 μm and about 10 μm and a high aspect ratio such that it has a depth which is between twice and twenty times its width.

7. A method according to claim 1 wherein an adhesion layer is deposited subsequent to step (a) and preceding step (b).

8. A method according to claim 1, wherein step (c) is carried out a plurality of times prior to step (d).

9. A method according to claim 1, wherein the sequence of steps (c) and (d) is repeated at least once, to achieve a stacked capacitor.

10. A method according to claim 1, wherein the substrate is cleaned between steps (c) and (d) by any one of more of wiping with a swab, shaking, or evaporation under vacuum or wiping whilst in an inverted orientation.

11. A method according to claim 1, wherein step (d) comprises subjecting the substrate to a first environment of between about 150° C. and about 300° C. for between 1 and 2 minutes, followed by subjecting it to a second environment of between about 300° C. and about 700° C. for between about 5 and about 10 minutes.

12. A method according to claim 10, wherein at least one of the first and second environment has a controlled oxygen level associated with it.

13. A method according to claim 1, wherein the layer of electrically conductive material and the further layer of electrically conductive material each comprise one of LNO, palladium or platinum.

* * * * *